US012118947B2

(12) United States Patent
Taya et al.

(10) Patent No.: US 12,118,947 B2
(45) Date of Patent: Oct. 15, 2024

(54) SCANNING LINE DRIVE CIRCUIT AND DISPLAY DEVICE PROVIDED WITH SAME (71) Applicant: Sharp Kabushiki Kaisha, Sakai (JP)

(72) Inventors: Nobuyuki Taya, Sakai (JP); Makoto Yokoyama, Sakai (JP); Naoki Ueda, Sakai (JP)

(73) Assignee: SHARP KABUSHIKI KAISHA, Sakai (JP)

(*) Notice: Subject to any disclaimer, the term of this patent is extended or adjusted under 35 U.S.C. 154(b) by 58 days.

(21) Appl. No.: 18/028,710

(22) PCT Filed: Oct. 2, 2020

(86) PCT No.: PCT/JP2020/037542
§ 371 (c)(1),
(2) Date: Mar. 27, 2023

(87) PCT Pub. No.: WO2022/070404
PCT Pub. Date: Apr. 7, 2022

(65) Prior Publication Data
US 2023/0335061 A1    Oct. 19, 2023

(51) Int. Cl.
G09G 3/3266    (2016.01)
G09G 3/3233    (2016.01)
G11C 19/28     (2006.01)

(52) U.S. Cl.
CPC ......... G09G 3/3266 (2013.01); G09G 3/3233 (2013.01); G11C 19/287 (2013.01);
(Continued)

(58) Field of Classification Search
CPC ............ G09G 3/3233; G09G 3/3266; G09G 2310/08; G09G 2310/0286; G11C 19/287; H01L 27/1255
See application file for complete search history.

(56) References Cited

U.S. PATENT DOCUMENTS

2005/0259494 A1    11/2005    Kimura et al.
2013/0044854 A1    2/2013     Yonemaru et al.
(Continued)

FOREIGN PATENT DOCUMENTS

JP    2006-011386 A    1/2006
WO   2011/092924 A1    8/2011
(Continued)

OTHER PUBLICATIONS

Official Communication issued in International Patent Application No. PCT/JP2020/037542, mailed on Dec. 22, 2020.

Primary Examiner — Abbas I Abdulselam
(74) Attorney, Agent, or Firm — Keating & Bennett, LLP (57) ABSTRACT The scanning line drive circuit has a configuration in which a plurality of unit circuits are connected in multiple stages. A unit circuit includes: a first transistor having a first conductive terminal to which a first-level voltage is applied and a second conductive terminal connected to a first node; a second transistor having a second conductive terminal to which a second-level voltage is applied; a third transistor having a first conductive terminal connected to the first node and a second conductive terminal connected to a first conductive terminal of the second transistor; a fourth transistor having a first conductive terminal connected to a control terminal of the third transistor, and having a second conductive terminal and a control terminal to both of which the second-level voltage is applied; and an output transistor having a control terminal connected to the first node and a second conductive terminal connected to an output terminal.

7 Claims, 9 Drawing Sheets (52) U.S. Cl.
    CPC ............... *G09G 2300/0819* (2013.01); *G09G 2300/0852* (2013.01); *G09G 2310/0286* (2013.01); *G09G 2310/08* (2013.01); *G09G 2320/041* (2013.01); *G09G 2320/043* (2013.01)

(56) References Cited

U.S. PATENT DOCUMENTS

| | | |
|---|---|---|
| 2013/0156148 A1 | 6/2013 | Sasaki et al. |
| 2018/0137831 A1 | 5/2018 | Murakami et al. |
| 2018/0149911 A1 | 5/2018 | Yamaguchi et al. |

FOREIGN PATENT DOCUMENTS

| | | |
|---|---|---|
| WO | 2012/029876 A1 | 3/2012 |
| WO | 2016/175117 A1 | 11/2016 |
| WO | 2016/190187 A1 | 12/2016 |

SCANNING LINE DRIVE CIRCUIT AND DISPLAY DEVICE PROVIDED WITH SAME

TECHNICAL FIELD

The present disclosure relates to a scanning line drive circuit included in a display device or the like.

BACKGROUND ART

Organic electroluminescence (hereinafter referred to as EL) display devices are widely used as thin, lightweight, and high-quality display devices. A typical organic EL display device includes a display portion, a scanning line drive circuit, a data line drive circuit, and a light-emission control line drive circuit. The display portion is formed on an organic EL panel using a thin-film transistor (hereinafter referred to as TFT). The scanning line drive circuit has a configuration in which a plurality of unit circuits are connected in multiple stages. Further, a technology of integrally forming a scanning line drive circuit with an organic EL panel (gate driver monolithic technology) has been put into practical use. Note that the scanning line is also referred to as a gate line, and the scanning line drive circuit is also referred to as a gate driver.

Figure 12:
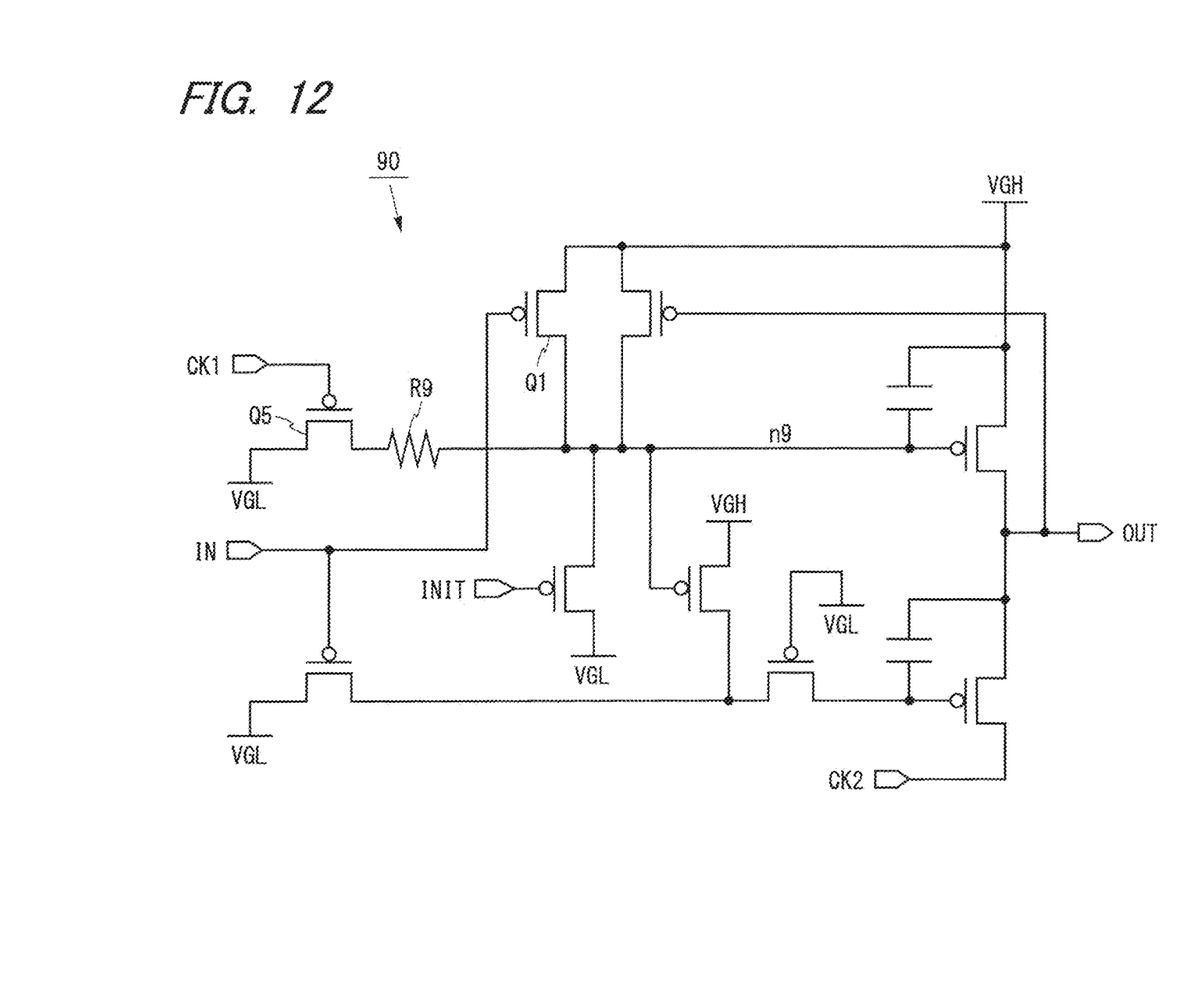
FIG. 12 is a circuit diagram of a unit circuit of a known scanning line drive circuit.

Various types of unit circuits have been known for scanning line drive circuits each formed integrally with an organic EL panel. FIG. 12 is a circuit diagram of a unit circuit of a known scanning line drive circuit. A unit circuit 90 illustrated in FIG. 12 includes a ratio circuit including TFTs Q1, Q5 and a resistor R9. The unit circuit 90 performs a set operation of setting a voltage of a node n9 to high level and a reset operation of setting the voltage of the node n9 to low level.

When an input signal IN and a clock signal CK1 are at low level, the TFTs Q1, Q5 are turned on. At this time, a high-level voltage VGH is applied to the node n9 via the TFT Q1, and a low-level voltage VGL is applied to the node n9 via the TFT Q5 and the resistor R9. The resistance value of the resistor R9 is sufficiently larger than the resistance value of the TFT Q1 in on-state, and hence the voltage of the node n9 goes to high level. As described above, the unit circuit 90 performs the set operation when the input signal IN and the clock signal CK1 are at low level.

When the input signal IN is at high level and the clock signal CK1 is at low level, the TFT Q1 is turned off and the TFT Q5 is turned on. At this time, the low-level voltage VGL is applied to the node n9 via the TFT Q5 and the resistor R9, and hence the voltage of the node n9 goes to low level. As described above, the unit circuit 90 performs the reset operation when the input signal IN is at high level and the clock signal CK1 is at low level.

In order to perform the set operation and the reset operation at high speed, a resistor having a high resistance value of several 100 kΩ to several MΩ is used as the resistor R9. The resistance value of the resistor R9 is, for example, 1.7 MΩ. When the scanning line drive circuit is formed integrally with the organic EL panel, the unit circuit 90 is formed using a p-channel TFT together with a pixel circuit included in the display portion. In this case, the resistor R9 is formed using a p-type semiconductor having a high resistance value. A scanning line drive circuit provided with a unit circuit including a ratio circuit is disclosed in, for example, Patent Documents 1 and 2.

CITATION LIST

Patent Documents

Patent Document 1: WO 2016/175117
Patent Document 2: WO 2016/190187

SUMMARY

Technical Problem

However, in the known scanning line drive circuit, the resistance value of the resistor R9 easily fluctuates under the influence of the ambient temperature, and the operation speed of the ratio circuit also easily fluctuates under the influence of the ambient temperature. Therefore, when the resistance value of the resistor R9 is affected by the ambient temperature and exceeds an allowable range at the time of design, the scanning line drive circuit malfunctions, and the display quality of the organic EL display device deteriorates significantly.

Therefore, a problem to be solved is to provide a scanning line drive circuit that prevents malfunction by using a ratio circuit that operates stably and at high speed.

Solution to Problem

The above problems can be solved by, for example, a scanning line drive circuit having a configuration in which a plurality of unit circuits are connected in multiple stages, each of the unit circuits including: a first transistor having a first conductive terminal to which a first-level voltage is applied and a second conductive terminal connected to a first node; a second transistor having a second conductive terminal to which a second-level voltage is applied; a third transistor having a first conductive terminal connected to the first node and a second conductive terminal connected to a first conductive terminal of the second transistor; a fourth transistor having a first conductive terminal connected to a control terminal of the third transistor, and having a second conductive terminal and a control terminal to both of which the second-level voltage is applied; and an output transistor having a control terminal connected to the first node and a second conductive terminal connected to an output terminal.

The above problem can also be solved by a display device provided with a plurality of pixel circuits each including a light-emitting element and the above scanning line drive circuit.

Effects of the Disclosure

According to the scanning line drive circuit and the display device, the third transistor functions as a resistor in the ratio circuit, and the resistance value of the resistor is hardly affected by the ambient temperature. A voltage is applied to the control terminal of the third transistor using the fourth transistor, whereby the voltage of the first node changes to the second level at high speed during the reset operation. Therefore, the malfunction of the scanning line drive circuit can be prevented using the ratio circuit that operates stably and at high speed.

DESCRIPTION OF EMBODIMENTS

First Embodiment

Figure 1:
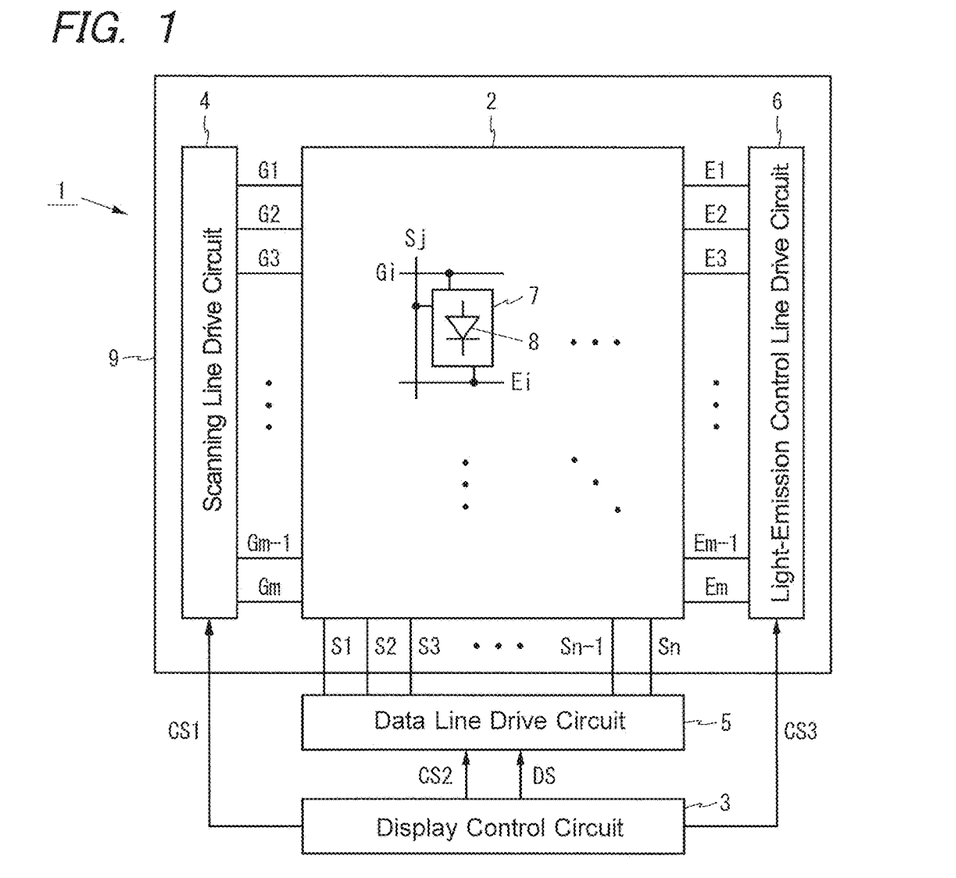
FIG. 1 is a block diagram illustrating a configuration of an organic EL display device provided with a scanning line drive circuit according to a first embodiment.

FIG. 1 is a block diagram illustrating a configuration of an organic EL display device provided with a scanning line drive circuit according to a first embodiment. An organic EL display device 1 illustrated in FIG. 1 includes a display portion 2, a display control circuit 3, a scanning line drive circuit 4, a data line drive circuit 5, and a light-emission control line drive circuit 6. Hereinafter, m and n are integers of 2 or more, i is an integer from 1 to m, and j is an integer from 1 to n.

The display portion 2 is formed on an organic EL panel 9 using a TFT. The scanning line drive circuit 4 and the light-emission control line drive circuit 6 are formed integrally with the organic EL panel 9 using TFTs. The data line drive circuit 5 is formed separately from the organic EL panel 9. Note that all or a part of the data line drive circuit 5 may be formed integrally with the organic EL panel 9 using a TFT, or all or a part of the light-emission control line drive circuit 6 may be formed separately from the organic EL panel 9.

The display portion 2 includes m scanning lines G1 to Gm, n data lines S1 to Sn, m light-emission control lines E1 to Em, and (m×n) pixel circuits 7. The scanning lines G1 to Gm and the light-emission control lines E1 to Em are arranged in parallel to each other. The data lines S1 to Sn are arranged in parallel to each other so as to be orthogonal to the scanning lines G1 to Gm. The scanning lines G1 to Gm and the data lines S1 to Sn intersect at (m×n) locations. The (m×n) pixel circuits 7 are arranged corresponding to intersections of the scanning lines G1 to Gm and the data lines S1 to Sn. The pixel circuit 7 includes an organic EL element 8 functioning as a light-emitting element. The pixel circuit 7 in the ith row and the jth column is connected to the scanning line Gi, the data line Sj, and the light-emission control line Ei. Note that the pixel circuit 7 in the ith row and the jth column may be connected to wiring except for the above wiring.

The display control circuit 3 outputs a control signal CS1 to the scanning line drive circuit 4, outputs a control signal CS2 and a video signal DS to the data line drive circuit 5, and outputs a control signal CS3 to the light-emission control line drive circuit 6. The scanning line drive circuit 4 drives the scanning lines G1 to Gm based on the control signal CS1. The data line drive circuit 5 drives the data lines S1 to Sn based on the control signal CS2 and the video signal DS. The light-emission control line drive circuit 6 drives the light-emission control lines E1 to Em based on the control signal CS3.

More specifically, the scanning line drive circuit 4 sequentially selects one scanning line from among the scanning lines G1 to Gm based on the control signal CS1, applies a selection voltage (here, a low-level voltage) to the selected scanning line, and applies a non-selection voltage (here, a high-level voltage) to the other scanning lines. Thus, during an ith horizontal period, the pixel circuits 7 (n pixel circuits) in the ith row are selected collectively. The data line drive circuit 5 applies n voltages corresponding to the video signal DS to the data lines S1 to Sn, respectively, based on the control signal CS2. As a result, n voltages are written to the selected n pixel circuits 7, respectively. A current flows through the organic EL element 8 in an amount corresponding to the voltage written to the pixel circuit 7, and the organic EL element 8 emits light with luminance corresponding to the amount of the flowing current.

An emission period and a non-emission period are set for each row of the pixel circuits 7. The light-emission control line drive circuit 6 applies an emission voltage (e.g., low-level voltage) to the light-emission control line Ei during the emission period of the pixel circuits 7 in the ith row, and applies a non-emission voltage (e.g., high-level voltage) to the light-emission control line Ei during the non-emission period of the pixel circuits 7 in the ith row.

Figure 2:
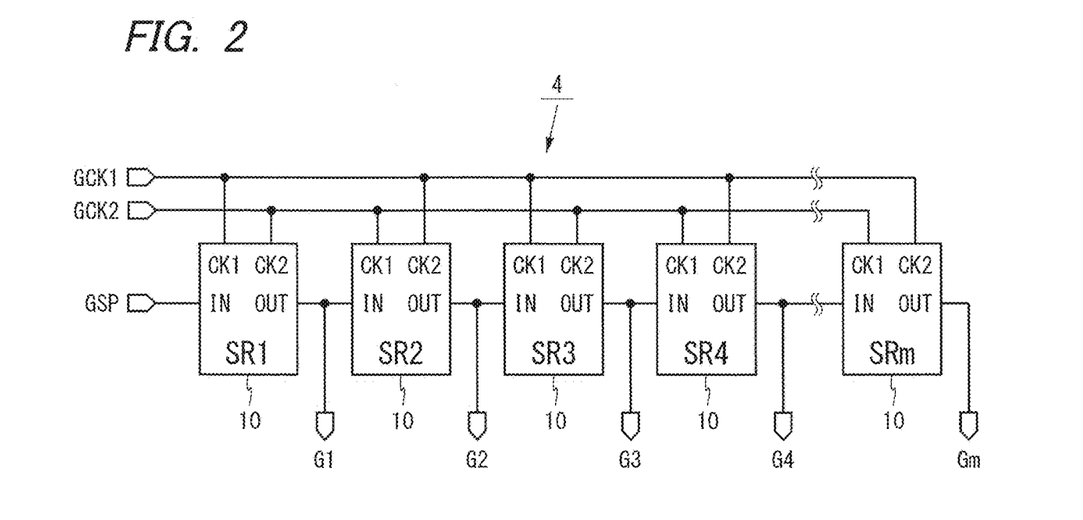
FIG. 2 is a block diagram illustrating a configuration of the scanning line drive circuit according to the first embodiment.

FIG. 2 is a block diagram illustrating a configuration of the scanning line drive circuit 4. As illustrated in FIG. 2, the scanning line drive circuit 4 has a configuration in which m unit circuits 10 are connected in multiple stages. The unit circuits 10 each include clock terminals CK1, CK2, an input terminal IN, an output terminal OUT, and an initialization terminal INIT (not illustrated). The unit circuits 10 are each supplied with the high-level voltage VGH and the low-level voltage VGL using wiring (not illustrated).

Hereinafter, the m unit circuits 10 are referred to as unit circuits in first to mth stages in the order of connection. In FIG. 2, the unit circuit in the ith stage is denoted as SRi. The control signal CS1 output from the display control circuit 3 to the scanning line drive circuit 4 includes an initialization signal INIT (not illustrated), gate clocks GCK1, GCK2, and a gate start pulse GSP. The initialization signal INIT is supplied to the initialization terminal INIT of the unit circuit 10 in each stage (not illustrated). The gate clock GCK1 is supplied to the clock terminals CK1 of the unit circuits 10 in the odd-numbered stages and the clock terminals CK2 of the unit circuits 10 in the even-numbered stages. The gate clock GCK2 is supplied to the clock terminals CK2 of the unit circuits 10 in the odd-numbered stages and the clock terminals CK1 of the unit circuits 10 in the even-numbered stages. The gate start pulse GSP is supplied to the input terminal IN of the unit circuit 10 in the first stage. The output terminal OUT of the unit circuit 10 in the ith stage is connected to the input terminal IN of the unit circuit 10 in the (i+1)th stage and the scanning line Gi.

Figure 3:
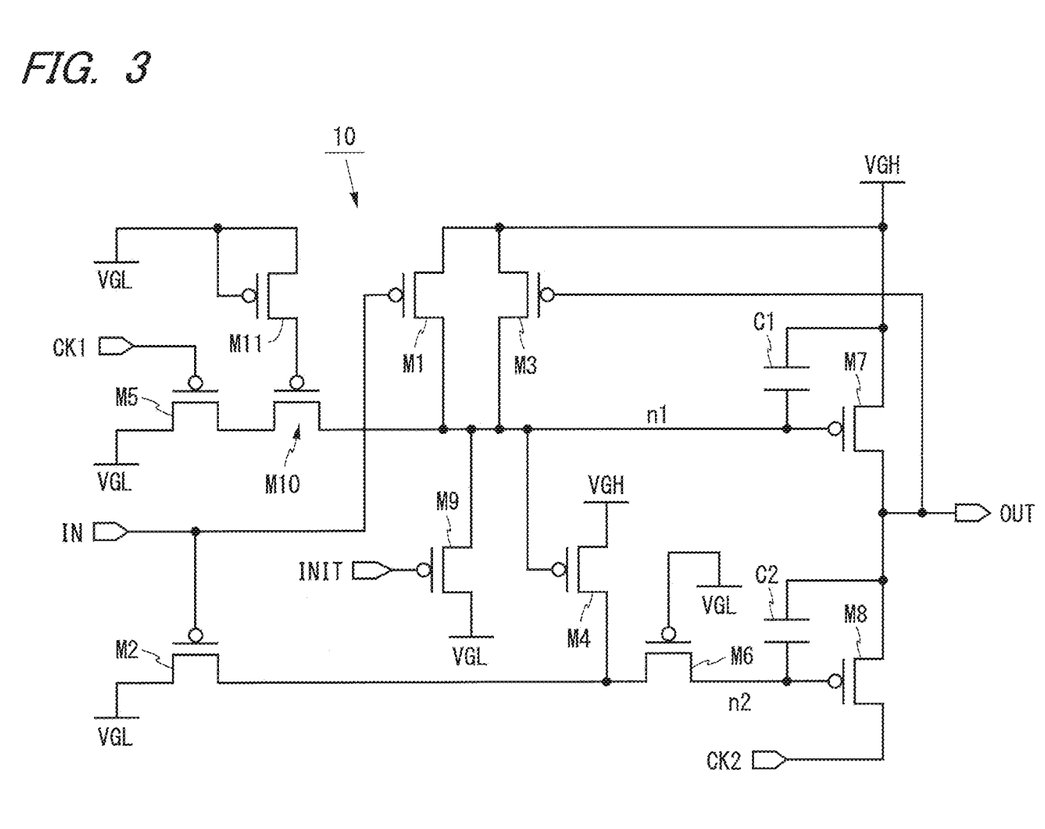
FIG. 3 is a circuit diagram of a unit circuit of the scanning line drive circuit illustrated in FIG. 2.

FIG. 3 is a circuit diagram of the unit circuit 10. As illustrated in FIG. 3, the unit circuit 10 includes 11 TFTs M1 to M11 and two capacitors C1, C2. The TFTs M1 to M11 are p-channel TFTs. The unit circuit 10 is obtained by replacing the resistor R9 with TFTs M10, M11 in the unit circuit 90 illustrated in FIG. 12.

Drain terminals of the TFTs M1, M3, source terminals of the TFTs M9, M10, and gate terminals of the TFTs M4, M7 are connected to a node n1. A source terminal of the TFT M5 is connected to a drain terminal of the TFT M10. One conductive terminal (a right conductive terminal in FIG. 3) of the TFT M6 and a gate terminal of the TFT M8 are connected to a node n2. A source terminal of the TFT M2 and a drain terminal of the TFT M4 are connected to the other conductive terminal of the TFT M6.

A gate terminal of the TFT M10 is connected to a source terminal of the TFT M11. A gate terminal of the TFT M9 is connected to the initialization terminal INIT. A gate terminal of the TFT M5 is connected to the clock terminal CK1. A drain terminal of the TFT M8 is connected to the clock terminal CK2. Gate terminals of the TFTs M1, M2 are connected to the input terminal IN. A gate terminal of the TFT M3, a drain terminal of the TFT M7, and a source terminal of the TFT M8 are connected to the output terminal OUT. The high-level voltage VGH is applied to source terminals of the TFTs M1, M3, M4, M7. The low-level voltage VGL is applied to drain terminals of the TFTs M2, M5, M9, M11 and gate terminals of the TFTs M6, M11. The capacitor C1 is provided between the gate terminal and a source terminal of the TFT M7. The capacitor C2 is provided between the gate terminal and the source terminal of the TFT M8.

The TFT M1 functions as a first transistor having a source terminal to which the high-level voltage VGH is applied and a drain terminal connected to the node n1. The TFT M5 functions as a second transistor having a drain terminal to which the low-level voltage VGL is applied. The TFT M10 functions as a third transistor having a source terminal connected to the node n1 and a drain terminal connected to the source terminal of the TFT M5. The TFT M11 functions as a fourth transistor having a source terminal connected to the gate terminal of the TFT M10, and having a drain terminal and a gate terminal to both of which the low-level voltage VGL is applied. The TFTs M1, M5, M10, M11 constitute a ratio circuit. The TFT M7 functions as an output transistor having a gate terminal connected to the node n1 and a drain terminal connected to the output terminal OUT.

The initialization signal INIT is at low level during an initialization period of the scanning line drive circuit 4, and is at high level otherwise. In the initialization period, the TFT M9 is turned on, and the voltage of the node n1 is initialized to low level. Except for the initialization period, the TFT M9 is always in off-state. The TFT M6 is always in on-state because the low-level voltage VGL is fixedly applied to the gate terminal of the TFT M6. Hence the TFTs M6, M9 do not affect the normal operation of the unit circuit 10.

With the same voltage being applied to the drain terminal and the gate terminal of the TFT M11, the TFT M11 is diode-connected. The source terminal of the TFT M11 is connected to the gate terminal of the TFT M10, so that the voltage of the gate terminal of the TFT M10 becomes a voltage close to the low-level voltage VGL or a voltage lower than the low-level voltage VGL (details will be described later). Hence the TFT M10 is always in on-state and does not affect the normal operation of the unit circuit 10. The TFT M10 has an on-resistance and functions as a resistor in the ratio circuit.

Figure 4:
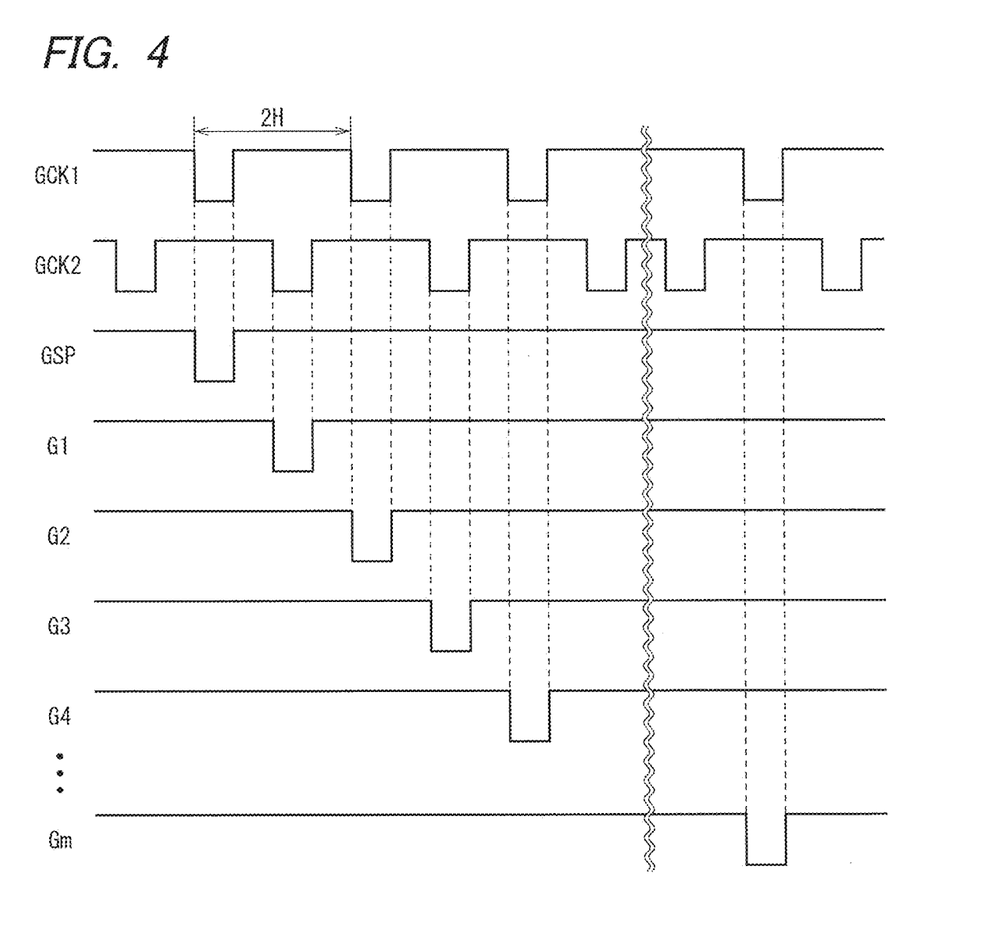
FIG. 4 is a timing chart of the scanning line drive circuit illustrated in FIG. 2.

FIG. 4 is a timing chart of the scanning line drive circuit 4. As illustrated in FIG. 4, the gate clocks GCK1, GCK2 are clock signals each having a cycle of two horizontal periods (2H). The length of the high-level period of each of the gate clocks GCK1, GCK2 is 3/2 horizontal periods, and the length of low-level period thereof is a 1/2 horizontal period. The gate clock GCK2 is delayed by one horizontal period from the gate clock GCK1. The gate start pulse GSP is at low level once in one frame period when the gate clock GCK1 is at low level, and is at high level otherwise.

Figure 5:
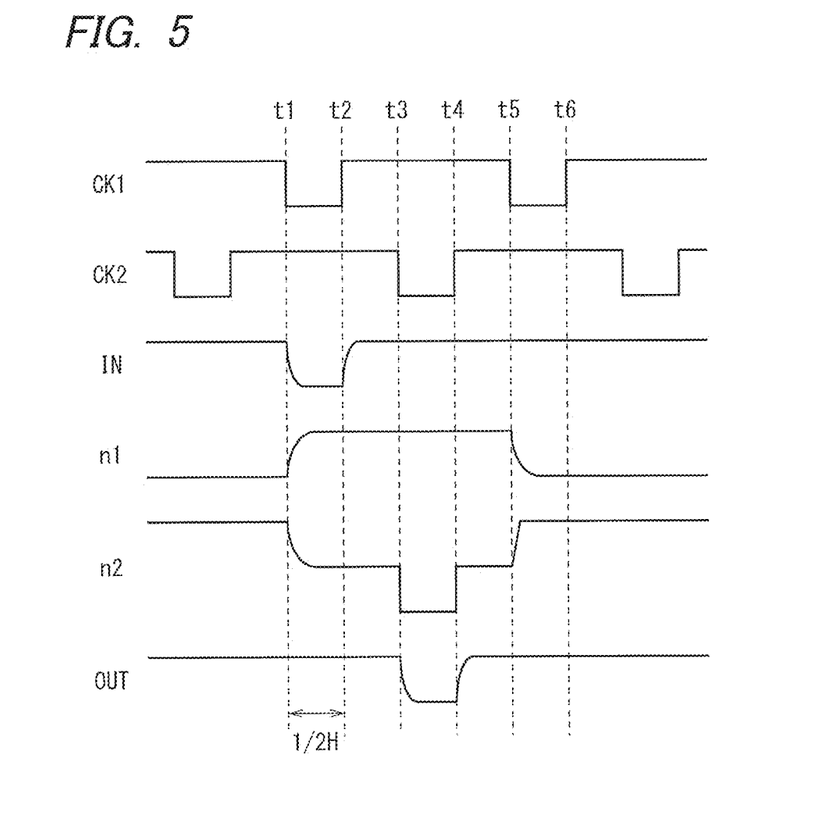
FIG. 5 is a timing chart of the unit circuit illustrated in FIG. 3.

FIG. 5 is a timing chart of the unit circuit 10. In FIG. 5, the intervals between times t1 to t6 are each a 1/2 horizontal period. Hereinafter, a signal input or output via a certain terminal is referred to by the same name as that of the terminal. For example, a signal input via the clock terminal CK1 is referred to as a clock signal CK1.

Immediately before time t1, the clock signals CK1, CK2, the input signal IN, the voltage of the node n2, and the output signal OUT are at high level, and the voltage of the node n1 is at low level. Thus, TFTs M1 to M3, M5, M8 are in off-state, and TFTs M4, M7 are in on-state.

At time t1, the clock signal CK1 and the input signal IN change to low level. Accordingly, the TFTs M1, M2, M5 are turned on. The high-level voltage VGH is applied to the node n1 via the TFT M1, and the low-level voltage VGL is applied to the node n1 via the TFTs M5, M10. The TFTs M1, M10 are formed such that the resistance value of the TFT M1 in on-state is smaller than the resistance value of the TFT M10 in on-state. For example, the channel width of the TFT M1 is formed to be larger than the channel width of the TFT M10. Hence the voltage of the node n1 changes to high level after time t1, and the TFTs M4, M7 are turned off. The low-level voltage VGL is applied to the node n2 via the TFT M2. Thus, when the TFT M4 is turned off, the voltage of the node n2 changes to low level, and accordingly, the TFT M8 is turned on. Next, at time t2, the clock signal CK1 and the input signal IN change to high level. Accordingly, the TFTs M1, M2, M5 are turned off.

Next, at time t3, the clock signal CK2 changes to low level. At this time, with the TFT M8 being in on-state, the output signal OUT changes to low level. The capacitor C2 is provided between the gate terminal and the source terminal of the TFT M8. Thus, while the output signal OUT is at low level, the voltage of the node n2 is at a level lower than the normal low level. Therefore, the low-level voltage of the output signal OUT does not rise by the threshold voltage of the TFT M8 but is at the same level as the low-level voltage of the clock signal CK2. When the output signal OUT changes to low level, the TFT M3 is turned on. The TFT M3 applies the high-level voltage VGH to the node n1 while the output signal OUT is at low level.

Next, at time t4, the clock signal CK2 changes to high level. At this time, with the TFT M8 being in on-state, the output signal OUT changes to high level. Accordingly, the voltage of the node n2 changes to the normal low level, and the TFT M3 is turned off.

Next, at time t5, the clock signal CK1 changes to low level. Accordingly, the TFT M5 is turned on. The low-level voltage VGL is applied to the node n1 via the TFTs M5, M10, and hence the voltage of the node n1 changes to low level. Accordingly, the TFTs M4, M7 are turned on, and the voltage of the node n2 changes to high level. Next, at time t6, the clock signal CK1 changes to high level, and accordingly, the TFT M5 is turned off.

As described above, the unit circuit 10 performs a set operation of setting the voltage of the node n1 to high level when the input signal IN and the clock signal CK1 are at low level, and performs a reset operation of setting the voltage of the node n1 to low level when the input signal IN is at high level and the clock signal CK1 is at low level. The voltage of the node n1 changes to high level after time t1 at which the input signal IN and the clock signal CK1 change to low level, and changes to low level after time t5 at which the clock signal CK1 changes to low level while the input signal IN is at high level. The voltage of the node n2 is at high level when the voltage of the node n1 is at low level, and is at low level otherwise. The output signal OUT is at low level for ½ horizontal period, which is delayed by one horizontal period from the input signal IN.

The output terminals OUT of the unit circuits 10 in the first to mth stages are connected to the scanning lines G1 to Gm, respectively. Thus, as illustrated in FIG. 4, the voltage of the scanning line G1 is at low level for ½ horizontal period, which is delayed by one horizontal period from the voltage of the gate start pulse GSP. The voltage of the scanning line Gi is at low level for ½ horizontal period, which is delayed by one horizontal period from the voltage of the scanning line Gi−1. Therefore, the voltages of the scanning lines G1 to Gm are sequentially delayed by one horizontal period and go to low level for ½ horizontal period.

Figure 6:
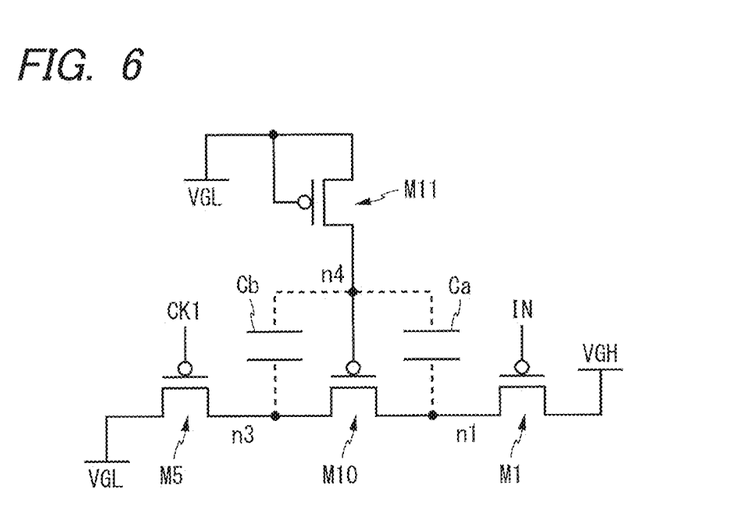
FIG. 6 is a circuit diagram of a ratio circuit included in the unit circuit illustrated in FIG. 3.

FIG. 6 is a circuit diagram of the ratio circuit included in the unit circuit 10. The ratio circuit illustrated in FIG. 6 includes TFTs M1, M5, M10, M11. FIG. 6 illustrates a parasitic capacitance Ca between the gate and the source of the TFT M10 and a parasitic capacitance Cb between the gate and the drain of the TFT M10. Hereinafter, a node to which the drain terminal of the TFT M10 is connected is referred to as n3, a node to which the gate terminal of the TFT M10 is connected is referred to as n4, and the threshold voltage of the TFT M11 is referred to as Vth (where Vth<0).

As described above, the voltage of the node n1 changes to high level after time t1 and changes to low level after time t5 (see FIG. 5). When the voltages at the nodes n1, n3 start increasing at time t1, the voltage of the node n4 connected to the nodes n1, n3 via the parasitic capacitances Ca, Cb also starts increasing. The voltage of the node n4 increases until the TFT M11 is turned on, and becomes (VGL−Vth) at the time when the TFT M11 is turned on. Thereafter, the voltage of the node n4 is maintained at (VGL−Vth) until immediately before time t5.

When the clock signal CK1 changes to low level at time t5, the voltages at the nodes n1, n3 decrease from the high level by (VGH−VGL+Vth). At this time, the voltage of the node n4 connected to the nodes n1, n3 via the parasitic capacitances Ca, Cb decreases from (VGL−Vth) by (VGH−VGL+Vth) to {(VGL−Vth)−(VGH−VGL+Vth)}. After time t5, the TFT M11 comes into on-state while the voltage of the node n4 is {(VGL−Vth)−(VGH−VGL+Vth)}. When a low voltage is applied to the gate terminal of the TFT M10, the capability of the TFT M10 as a source follower circuit increases. Thus, the voltage of the node n1 connected to the source terminal of the TFT M10 decreases to (VGL−Vth) in a short time.

Figure 7:
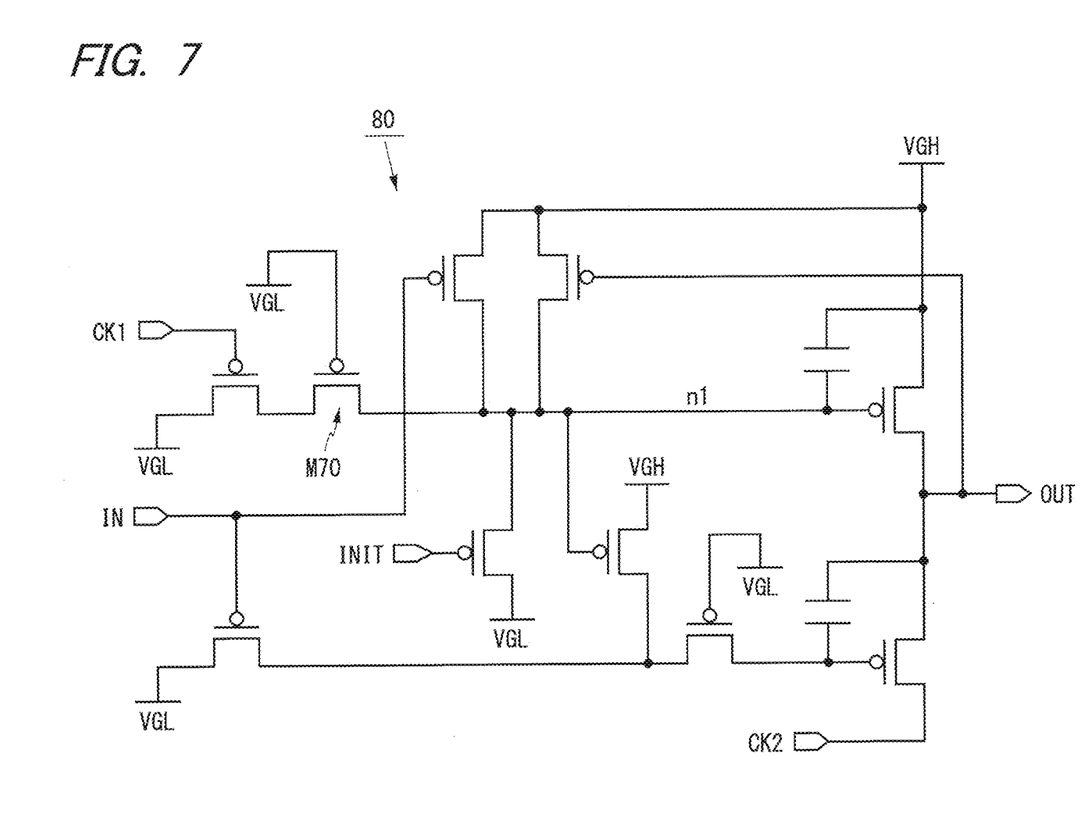
FIG. 7 is a circuit diagram of a unit circuit of a scanning line drive circuit according to a comparative example.

Hereinafter, the scanning line drive including the unit circuit 90 illustrated in FIG. 12 will be referred to as a "known scanning line drive circuit", and the scanning line drive including the unit circuit 80 illustrated in FIG. 7 will be referred to as a "scanning line drive circuit according to a comparative example". In comparison with these scanning line drive circuits, effects of the scanning line drive circuit 4 according to the present embodiment will be described.

The unit circuit 90 of the known scanning line drive circuit includes the resistor R9. When the resistor R9 is formed using a p-type semiconductor, the resistance value of the resistor R9 easily fluctuates under the influence of the ambient temperature, and the operation speed of the ratio circuit also easily fluctuates under the influence of the ambient temperature. Thus, when the resistance value of the resistor R9 exceeds an allowable range at the time of design under the influence of the ambient temperature, the known scanning line drive circuit malfunctions, and the display quality of the organic EL display device provided with the known scanning line drive circuit deteriorates significantly.

In contrast, the unit circuit 10 of the scanning line drive circuit 4 includes TFTs M10, M11 instead of the resistor R9. The on-state resistance value of M10 hardly varies depending on the ambient temperature, and hence the operating speed of the ratio circuit also hardly varies depending on the ambient temperature. Therefore, according to the scanning line drive circuit 4 of the present embodiment, the malfunction of the scanning line drive circuit 4 can be prevented using the ratio circuit that operates stably, and the deterioration of the display quality of the organic EL display device 1 can be prevented.

Figure 8:
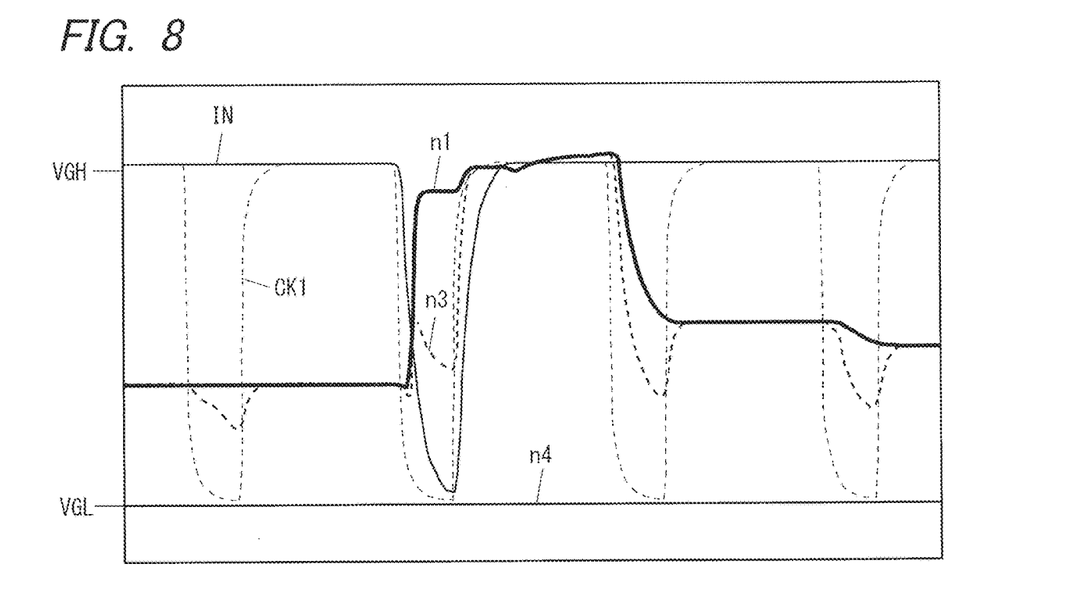
FIG. 8 is a diagram illustrating a simulation waveform of the scanning line drive circuit according to the comparative example.
Figure 9:
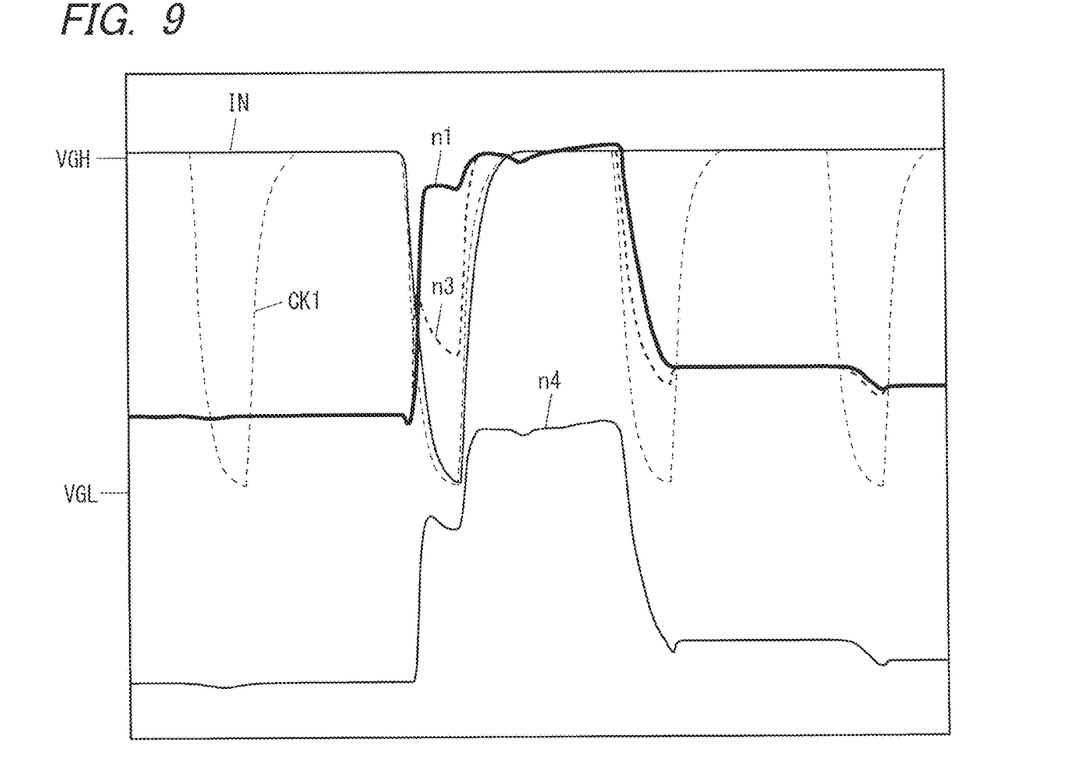
FIG. 9 is a diagram illustrating a simulation waveform of the scanning line drive circuit illustrated in FIG. 2.

FIG. 8 is a diagram illustrating a simulation waveform of the scanning line drive circuit according to the comparative example. FIG. 9 is a diagram illustrating a simulation waveform of the scanning line drive circuit 4. FIGS. 8 and 9 illustrate changes in the voltages at the nodes n1, n3, n4 when the input signal IN and the clock signal CK1 change.

In a unit circuit 80 of the scanning line drive circuit according to the comparative example, the low-level voltage VGL is applied to a gate terminal of the TFT M70. Thus, the voltage of the node n4 (the voltage of the gate terminal of TFT M70) is constant. The capability of the source follower circuit including the TFT M70 is limited, and hence in the unit circuit 80, the voltage of the node n4 cannot be lowered to the same level as that in the unit circuit 90.

In contrast, in the unit circuit 10 of the scanning line drive circuit 4, the gate terminal of the TFT M10 is connected to the source terminal of the TFT M11, and the voltage of the gate terminal of the TFT M10 is lower than the low-level voltage VGL. Thus, the capability of the TFT M10 as a source follower circuit increases, and the voltage of the node n1 goes to low level in a short time during the reset operation. Therefore, according to the scanning line drive circuit 4 of the present embodiment, the voltage of the node n1 can be lowered to low level in a short time at the time of the reset operation, and the malfunction of the scanning line drive circuit 4 can be prevented.

As described above, the scanning line drive circuit 4 according to the present embodiment has a configuration in which a plurality of unit circuits 10 are connected in multiple stages, and the unit circuit 10 includes: a first transistor (TFT M1) having a first conductive terminal (source terminal) to which a first-level voltage (high-level voltage VGH) is applied and a second conductive terminal (drain terminal) connected to a first node (node n1); a second transistor (TFT M5) having a second conductive terminal to which a second-level voltage (low-level voltage VGL) is applied; a third transistor (TFT M10) having a first conductive terminal connected to the first node and a second conductive terminal connected to a first conductive terminal of the second transistor; a fourth transistor (TFT M11) having a first conductive terminal connected to a control terminal (gate terminal) of the third transistor, and having a second conductive terminal and a control terminal to both of which the second-level voltage is applied; and an output transistor (TFT M7) having a control terminal connected to the first node and a second conductive terminal connected to the output terminal OUT.

The first to fourth transistors and the output transistor are p-channel transistors, the first-level voltage is a high-level voltage, and the second-level voltage is a low-level voltage. The output signal OUT of the unit circuit 10 in the preceding stage is provided to a control terminal of the first transistor, the clock signal CK1 is provided to a control terminal of the second transistor, and a first-level voltage is applied to a first conductive terminal of the output transistor.

According to the scanning line drive circuit 4 of the present embodiment, the third transistor functions as a resistor in the ratio circuit, and the resistance value of the resistor is hardly affected by the ambient temperature. A voltage is applied to the control terminal of the third transistor using the fourth transistor, whereby the voltage of the first node changes to the second level at high speed during the reset operation. Therefore, the malfunction of the scanning line drive circuit 4 can be prevented using the ratio circuit that operates stably and at high speed.

Second Embodiment

The scanning line drive circuit according to the second embodiment has the same configuration as the scanning line drive circuit 4 according to the first embodiment (see FIG. 2). The scanning line drive circuit according to the present embodiment includes the following unit circuit instead of the unit circuit 10 according to the first embodiment.

Figure 10:
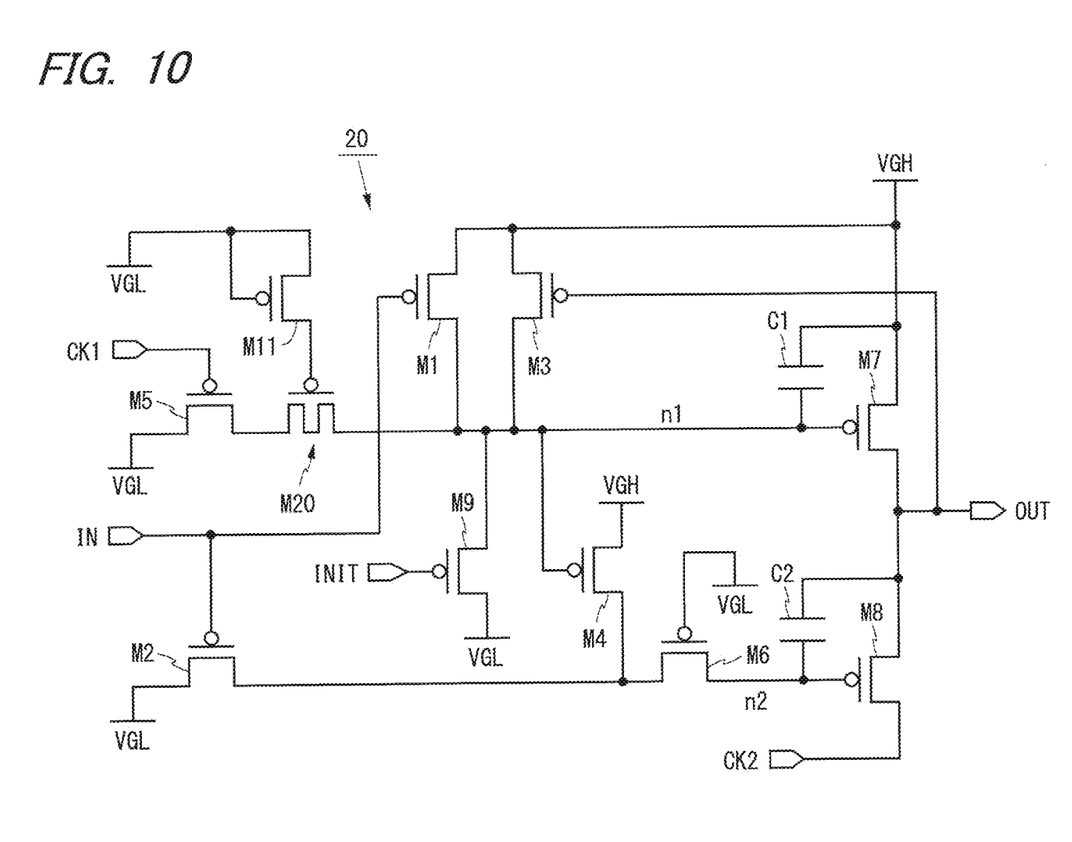
FIG. 10 is a circuit diagram of a unit circuit of a scanning line drive circuit according to a second embodiment.

FIG. 10 is a circuit diagram of a unit circuit of the scanning line drive circuit according to the present embodiment. A unit circuit 20 illustrated in FIG. 10 is obtained by replacing the TFT M10 with the TFT M20 in the unit circuit 10. The TFT M20 is a p-channel transistor and is a double gate transistor having two gate terminals.

A source terminal (a conductive terminal on the right side in FIG. 10) of the TFT M20 is connected to the node n1. A drain terminal of the TFT M20 is connected to the source terminal of the TFT M5. Two gate terminals of the TFT M20 are connected to the source terminal of the TFT M11. The TFT M20 functions as a third transistor having a source terminal connected to the node n1, a drain terminal connected to the source terminal of the TFT M5, and a gate terminal connected to the source terminal of the TFT M11.

In the unit circuit 20 of the scanning line drive circuit according to the present embodiment, the third transistor (TFT M20) is a double gate transistor having two control terminals. With the scanning line drive circuit according to the present embodiment, in addition to the same effects as those of the scanning line drive circuit 4 according to the first embodiment, it is possible to suppress a leakage current from the control terminal of the output transistor (the gate terminal of the TFT M7) and to reduce power consumption of the scanning line drive circuit.

Third Embodiment

A scanning line drive circuit according to a third embodiment has the same configuration as the scanning line drive circuit 4 according to the first and second embodiments (see FIG. 2). The scanning line drive circuit according to the present embodiment includes the following unit circuit instead of the unit circuit 10 according to the first embodiment.

Figure 11:
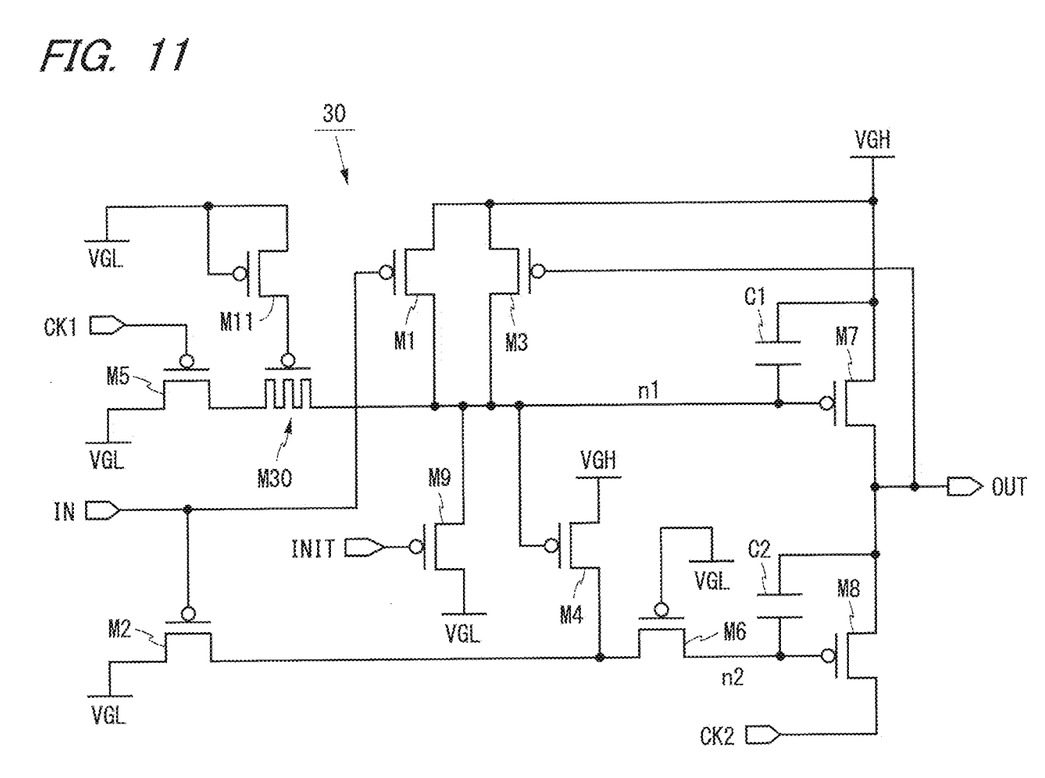
FIG. 11 is a circuit diagram of a unit circuit of a scanning line drive circuit according to a third embodiment.

FIG. 11 is a circuit diagram of a unit circuit of the scanning line drive circuit according to the present embodiment. The unit circuit 30 illustrated in FIG. 11 is obtained by replacing the TFT M10 with the TFT M30 in the unit circuit 10. The TFT M30 is a p-channel transistor and is a triple gate transistor having three gate terminals.

A source terminal (a conductive terminal on the right side in FIG. 11) of the TFT M30 is connected to the node n1. A drain terminal of the TFT M30 is connected to the source terminal of the TFT M5. The three gate terminals of the TFT M30 are connected to the source terminal of the TFT M11. The TFT M30 functions as a third transistor having a source terminal connected to the node n1, a drain terminal connected to the source terminal of the TFT M5, and a gate terminal connected to the source terminal of the TFT M11.

In a unit circuit 30 of the scanning line drive circuit according to the present embodiment, the third transistor (TFT M30) is a triple gate transistor having three control terminals. The scanning line drive circuit according to the present embodiment can obtain the same effects as those of the scanning line drive circuit according to the second embodiment.

As for the scanning line drive circuits according to the embodiments described above, various variants can be constituted. For example, a unit circuit of a scanning line drive circuit according to a variant may have another configuration as long as the unit circuit includes first to fourth transistors and an output transistor connected in the above manner. In the unit circuit of the scanning line drive circuit according to the variant, the third transistor may be a multi-gate transistor having a plurality of control terminals. The display device provided with the scanning line drive circuit according to the variant may include an arbitrary pixel circuit.

Although the organic EL display device provided with the pixel circuit including the organic EL element (organic light-emitting diode) has been described as an example of the display device provided with the pixel circuit including the light-emitting element, an inorganic EL display device provided with a pixel circuit including an inorganic light-emitting diode, a quantum-dot light-emitting diode (QLED) display device provided with a pixel circuit including a quantum-dot light-emitting diode, or a light-emitting diode (LED) display device provided with a pixel circuit including a mini LED or a micro LED may be configured by a similar method. The features of the scanning line drive circuits and the display devices described above may be arbitrarily combined as long as the features are not contrary to the nature thereof to constitute a scanning line drive circuit and a display device having the features of the above embodiments and variants.

DESCRIPTION OF REFERENCE CHARACTERS

1: ORGANIC EL DISPLAY DEVICE
2: DISPLAY PORTION
3: DISPLAY CONTROL CIRCUIT
4: SCANNING LINE DRIVE CIRCUIT
5: DATA LINE DRIVE CIRCUIT
6: LIGHT-EMISSION CONTROL LINE DRIVE CIRCUIT
7: PIXEL CIRCUIT
8: ORGANIC EL ELEMENT
9: ORGANIC EL PANEL
10, 20, 30: UNIT CIRCUIT

The invention claimed is:
1. A scanning line drive circuit having a configuration in which a plurality of unit circuits are connected in multiple stages,
wherein each of the unit circuits includes a first transistor having a first conductive terminal to which a first-level voltage is applied and a second conductive terminal connected to a first node,
a second transistor having a second conductive terminal to which a second-level voltage is applied,
a third transistor having a first conductive terminal connected to the first node and a second conductive terminal connected to a first conductive terminal of the second transistor,
a fourth transistor having a first conductive terminal connected to a control terminal of the third transistor, and having a second conductive terminal and a control terminal to both of which the second-level voltage is applied, and
an output transistor having a control terminal connected to the first node and a second conductive terminal connected to an output terminal.

2. The scanning line drive circuit according to claim 1, wherein the third transistor is a double gate transistor having two control terminals.

3. The scanning line drive circuit according to claim 1, wherein the third transistor is a triple gate transistor having three control terminals.

4. The scanning line drive circuit according to claim 1, wherein the third transistor is a multi-gate transistor having a plurality of control terminals.

5. The scanning line drive circuit according to claim 1, wherein
the first to fourth transistors and the output transistor are p-channel transistors,
the first-level voltage is a high-level voltage, and
the second-level voltage is a low-level voltage.

6. The scanning line drive circuit according to claim 1, wherein
an output signal of a unit circuit in a preceding stage is provided to a control terminal of the first transistor, and
a clock signal is provided to a control terminal of the second transistor, and
the first-level voltage is applied to a first conductive terminal of the output transistor.

7. A display device comprising:
a plurality of pixel circuits each including a light-emitting element; and
the scanning line drive circuit according to claim 1.

* * * * *